United States Patent
Hong

(10) Patent No.: US 11,151,118 B2
(45) Date of Patent: Oct. 19, 2021

(54) DYNAMIC THRESHOLD ADJUSTMENT BASED ON PERFORMANCE TREND DATA

(71) Applicant: ServiceNow, Inc., Santa Clara, CA (US)

(72) Inventor: Tao Hong, Cupertino, CA (US)

(73) Assignee: ServiceNow, Inc., Santa Clara, CA (US)

( * ) Notice: Subject to any disclaimer, the term of this patent is extended or adjusted under 35 U.S.C. 154(b) by 419 days.

(21) Appl. No.: 16/150,074

(22) Filed: Oct. 2, 2018

(65) Prior Publication Data

US 2020/0104392 A1   Apr. 2, 2020

(51) Int. Cl.
  *G06F 16/28* (2019.01)
  *G06F 16/9535* (2019.01)
  *G06F 11/30* (2006.01)
  *G06F 11/34* (2006.01)
  *H03M 7/30* (2006.01)
  *G06F 16/23* (2019.01)

(52) U.S. Cl.
  CPC ...... *G06F 16/2365* (2019.01); *G06F 11/3082* (2013.01); *G06F 11/3409* (2013.01); *G06F 16/285* (2019.01); *G06F 16/9535* (2019.01); *H03M 7/30* (2013.01)

(58) Field of Classification Search
  None
  See application file for complete search history.

(56) References Cited

U.S. PATENT DOCUMENTS

| | | |
|---|---|---|
| 6,678,887 B1 | 1/2004 | Hallman |
| 6,816,898 B1 | 11/2004 | Scarpelli |
| 6,882,997 B1 * | 4/2005 | Zhang .................. G06K 9/6218 707/737 |
| 7,020,706 B2 | 3/2006 | Cates |
| 7,716,353 B2 | 5/2010 | Golovinsky |
| 7,769,718 B2 | 8/2010 | Murley |
| 7,925,981 B2 | 4/2011 | Pourheidari |
| 8,402,127 B2 | 3/2013 | Solin |
| 8,497,788 B1 * | 7/2013 | Miller ................. H03M 7/3093 341/87 |
| 8,612,408 B2 | 12/2013 | Trinon |

(Continued)

*Primary Examiner* — Robert W Beausoliel, Jr.
*Assistant Examiner* — Cheryl M Shechtman
(74) *Attorney, Agent, or Firm* — Fletcher Yoder, P.C.

(57) ABSTRACT

The present disclosure includes analyzing client instance performance trends to predict future client instance performance and adjusting thresholds used to send resource utilization alerts based on analyzing the client instance performance trends. In particular, a data center providing a platform as a service includes a database that stores performance data associated with client instances. The data center also includes alignment logic that temporally aligns the performance data, and a frequency based filter that compresses the aligned performance data based on frequency of values. The data center further includes dynamic threshold adjustment logic that adjusts thresholds associated with sending performance trend alerts based on analyzing the compressed set of performance data. In this manner, the thresholds may be dynamically adjusted for changing circumstances and/or relevant details associated with resource usage, and thus may more accurately send performance trend alerts indicative of situations when resource utilization becomes high and resources become low.

19 Claims, 10 Drawing Sheets

(56) References Cited

U.S. PATENT DOCUMENTS

| | | |
|---|---|---|
| 8,832,652 B2 | 9/2014 | Mueller |
| 9,065,783 B2 | 6/2015 | Ding |
| 9,098,322 B2 | 8/2015 | Apte |
| 9,122,552 B2 | 9/2015 | Whitney |
| 9,317,327 B2 | 4/2016 | Apte |
| 9,363,252 B2 | 6/2016 | Mueller |
| 9,535,737 B2 | 1/2017 | Joy |
| 9,557,969 B2 | 1/2017 | Sharma |
| 9,645,833 B2 | 5/2017 | Mueller |
| 9,654,473 B2 | 5/2017 | Mueller |
| 9,766,935 B2 | 9/2017 | Kelkar |
| 9,805,322 B2 | 10/2017 | Kelkar |
| 9,819,729 B2 | 11/2017 | Moon |
| 10,069,972 B1 * | 9/2018 | Molander ........... H04M 3/5238 |
| 2016/0103665 A1 * | 4/2016 | Liu .................... G06F 11/3644 717/158 |
| 2017/0147681 A1 * | 5/2017 | Tankersley ............ G06F 11/321 |
| 2018/0284737 A1 * | 10/2018 | Cella .................. G05B 19/4183 |
| 2019/0138420 A1 * | 5/2019 | Harutyunyan ...... G06F 11/3006 |

\* cited by examiner

DYNAMIC THRESHOLD ADJUSTMENT BASED ON PERFORMANCE TREND DATA

BACKGROUND

The present disclosure relates generally to client instance performance trends as provided by a cloud computing service, and, more particularly, analyzing the client instance performance trends and adjusting thresholds used to send resource utilization alerts based on analyzing the client instance performance trends.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Cloud computing relates to the sharing of computing resources that are generally accessed via the Internet. In particular, a cloud computing infrastructure allows users, such as individuals and/or enterprises, to access a shared pool of computing resources, such as servers, storage devices, networks, applications, and/or other computing based services. By doing so, users are able to access computing resources on demand that are located at remote locations. These resources may be used to perform a variety of computing functions (e.g., storing and/or processing large quantities of computing data). For enterprise and other organization users, cloud computing provides flexibility in accessing cloud computing resources without accruing large up-front costs, such as purchasing expensive network equipment or investing large amounts of time in establishing a private network infrastructure. Instead, by utilizing cloud computing resources, users are able redirect their resources to focus on their enterprise's core functions.

In modern communication networks, examples of cloud computing services a user may utilize include so-called infrastructure as a service (IaaS), software as a service (SaaS), and platform as a service (PaaS) technologies. Infrastructure as a service is a model in which providers abstract away the complexity of hardware infrastructure and provide rapid, simplified provisioning of virtual servers and storage, giving enterprises access to computing capacity on demand. In such an approach, however, a user may be left to install and maintain platform components and applications. Software as a service is a delivery model that provides software as a service rather than an end product. Instead of utilizing a local network or individual software installations, software is typically licensed on a subscription basis, hosted on a remote machine, and accessed by client customers as needed. For example, users are generally able to access a variety of enterprise and/or information technology (IT)-related software via a web browser. Platform as a service acts an extension of SaaS that goes beyond providing software services by offering customizability and expandability features to meet a user's needs. For example, platform as a service can provide a cloud-based developmental platform for users to develop, modify, and/or customize applications and/or automating enterprise operations without maintaining network infrastructure and/or allocating computing resources normally associated with these functions.

Problems may arise when resource utilization becomes high and resources become low. For example, during rush or peak hours (e.g., during work hours on a weekday), a larger number of users may be using a cloud computing service to develop their respective software applications, causing a large amount of resources to be used and a small number of resources to remain available to be distributed. As such, users of the service may experience delays in completing their tasks, or, in some cases, the tasks may be unable to be performed altogether. To anticipate such circumstances, the cloud computing service may set thresholds associated with, for example, a number of users using the cloud computing service, a number of transactions performed by the cloud computing service, or other similar thresholds. When these thresholds are exceeded, the cloud computing service and may send an alert to, for example, an engineer maintaining the service that there may be an impending resource allocation problem. The engineer may then take appropriate precautions (e.g., rationing the remaining resources, reallocating the resources, and the like.) However, typically these thresholds are fixed numbers and cannot change dynamically as circumstances change (e.g., as the number of users drop) or factor in relevant details associated with resource usage (e.g., the time of day or the day of the week).

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Information Technology (IT) networks may include a number of computing devices, server systems, databases, and the like that generate, collect, and store information. As increasing amounts of data representing vast resources become available, it becomes increasingly difficult to analyze the data, interact with the data, and/or provide reports for the data. The current embodiments enable customized widgets to be generated for such data, enabling a visualization of certain indicators for the data for rapid and/or real-time monitoring of the data.

The present disclosure includes analyzing the client instance performance trends to predict future client instance performance and adjusting thresholds used to send resource utilization alerts based on analyzing the client instance performance trends. In particular, a data center providing a platform as a service has a database that stores performance data associated with client instances communicatively coupled to client devices. The data center also includes alignment logic that temporally aligns the performance data, and a frequency based filter that compresses the aligned performance data based on frequency of values. The data center further includes dynamic threshold adjustment logic that adjusts thresholds associated with sending performance trend alerts based on analyzing the compressed set of performance data. In this manner, the thresholds may be dynamically adjusted for, for example, changing circumstances (e.g., a change in the number of users using the platform as a service) and/or relevant details associated with resource usage (e.g., the time of day and/or the day of the week), and thus may more accurately send performance trend alerts indicative of situations when resource utilization becomes high and resources become low.

Moreover, the data center may classify, group, and/or pattern match the performance data based on historical trends to characterize the performance data as indicative of certain circumstances, such as whether resources are likely to become insufficient to handle upcoming utilization. In this manner, analytics performed by the data center may be more accurate and may better anticipate future usage of the resources.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
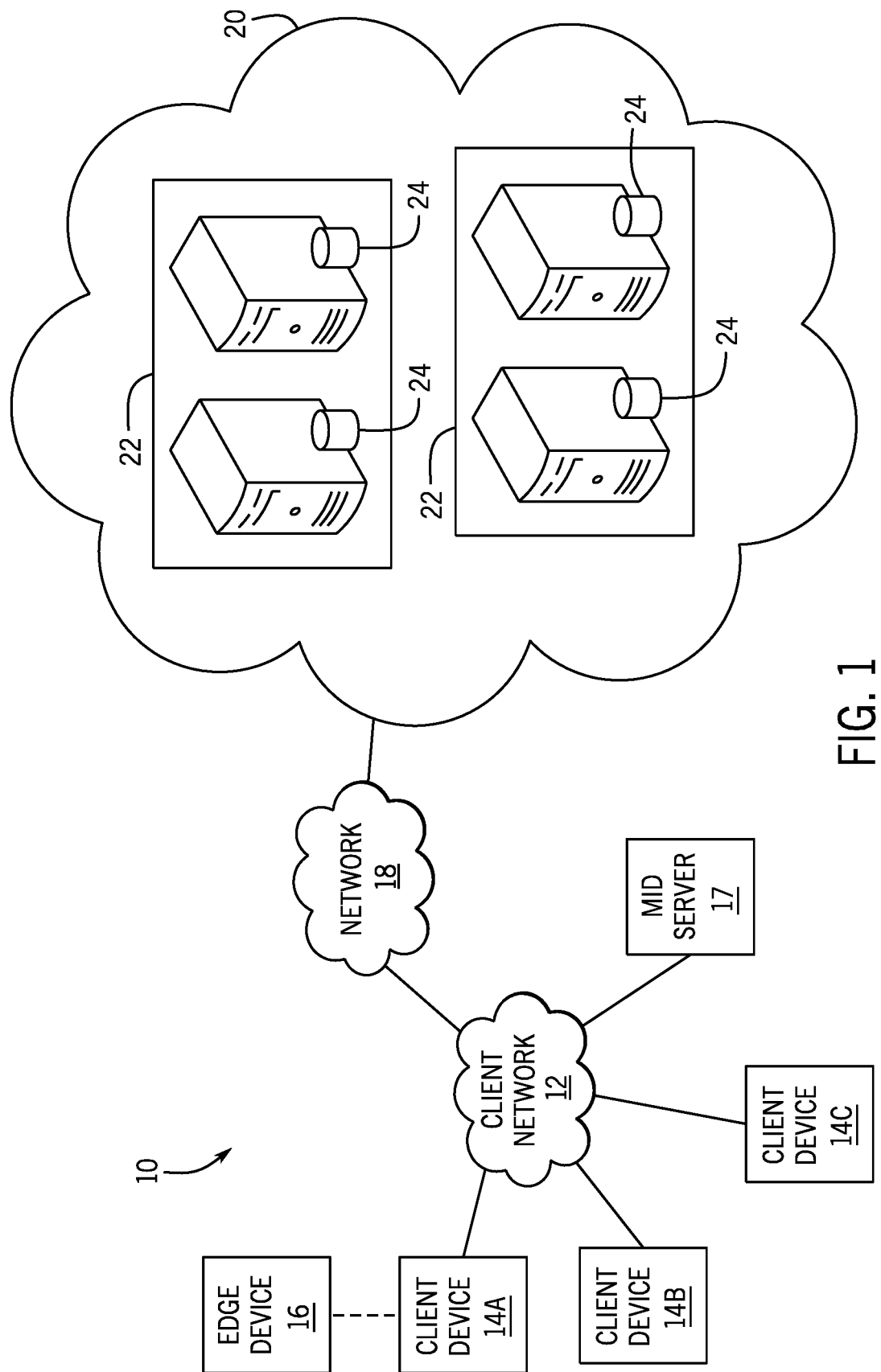
FIG. 1 is a block diagram of an embodiment of a cloud computing system in which embodiments of the present disclosure may operate.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and enterprise-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As used herein, the term "computing system" refers to a single electronic computing device that includes, but is not limited to a single computer, virtual machine, virtual container, host, server, laptop, and/or mobile device, or to a plurality of electronic computing devices working together to perform the function described as being performed on or by the computing system. As used herein, the term "medium" refers to one or more non-transitory, computer-readable physical media that together store the contents described as being stored thereon. Embodiments may include non-volatile secondary storage, read-only memory (ROM), and/or random-access memory (RAM). As used herein, the term "application" refers to one or more computing modules, programs, processes, workloads, threads and/or a set of computing instructions executed by a computing system. Example embodiments of an application include software modules, software objects, software instances and/or other types of executable code. As used herein, the terms alerts, incidents (INTs), changes (CHGs), and problems (PRBs) are used in accordance with the generally accepted use of the terminology in the context of servicing or manaing an information technology infrastructure, such as a configuration management database (CMDB). For example, the term "issues" with respect to a configuration item (CI) of a CMDB collectively refers to alerts, INTs, CHGs, and PRBs associated with the CI.

The present disclosure includes analyzing client instance performance trends to predict future client instance performance and adjusting thresholds used to send resource utilization alerts based on analyzing the client instance performance trends. In particular, a data center providing a cloud computing service, such as a platform as a service, that has a database that stores performance data associated with client instances may be communicatively coupled to client devices. The data center also includes alignment logic that temporally aligns the performance data, and a frequency based filter that compresses the aligned performance data based on frequency of values. The data center further includes dynamic threshold adjustment logic that adjusts thresholds associated with sending performance trend alerts based on analyzing the compressed set of performance data. In this manner, the thresholds may be dynamically adjusted for, for example, changing circumstances (e.g., a change in the number of users using the cloud computing service) and/or relevant details associated with resource usage (e.g., the time of day and/or the day of the week), and thus more accurately sends performance trend alerts indicative of situations when resource utilization becomes high and resources become low.

Moreover, the data center may classify, group, and/or pattern match the performance data based on historical trends to characterize the performance data as indicative of certain circumstances, such as whether resources are likely to become insufficient to handle upcoming utilization. In this manner, analytics performed by the data center may be more accurate and may better anticipate future usage of the resources.

With the preceding in mind, the following figures relate to various types of generalized system architectures or configurations that may be employed to provide services to an organization in an instance-based framework on which the present approaches may be employed. Correspondingly, these system and platform examples may also relate to systems and platforms on which the techniques discussed herein may be implemented or otherwise utilized. Turning now to FIG. 1, a schematic diagram of an embodiment of a computing system 10, such as a cloud computing system, where embodiments of the present disclosure may operate, is illustrated. Computing system 10 may include a client network 12, network 18 (e.g., the Internet), and a cloud-based platform 20. In some implementations, the cloud-based platform may be a configuration management database (CMDB) platform. In one embodiment, the client network 12 may be a local private network, such as local area network (LAN) having a variety of network devices that include, but are not limited to, switches, servers, and routers. In another embodiment, the client network 12 represents an enterprise network that could include one or more LANs, virtual networks, data centers 22, and/or other remote networks. As shown in FIG. 1, the client network 12 is able to connect to one or more client devices 14A, 14B, and 14C so that the client devices are able to communicate with each other and/or with the network hosting the platform 20. The client devices 14A-C may be computing systems and/or other types of computing devices generally referred to as Internet of Things (IoT) devices that access cloud computing services, for example, via a web browser application or via an edge device 16 that may act as a gateway between the client devices and the platform 20. FIG. 1 also illustrates that the client network 12 includes an administration or managerial device or server, such as a management, instrumentation, and discovery (MID) server 17 that facilitates communication of data between the network hosting the platform 20, other external applications, data sources, and services, and the client network 12. Although not specifically illustrated in FIG. 1, the client network 12 may also include a connecting network device (e.g., a gateway or router) or a combination of devices that implement a customer firewall or intrusion protection system.

For the illustrated embodiment, FIG. 1 illustrates that client network 12 is coupled to a network 18. The network 18 may include one or more computing networks, such as other LANs, wide area networks (WAN), the Internet, and/or other remote networks, to transfer data between the client devices 14A-C and the network hosting the platform 20. Each of the computing networks within network 18 may contain wired and/or wireless programmable devices that operate in the electrical and/or optical domain. For example, network 18 may include wireless networks, such as cellular networks (e.g., Global System for Mobile Communications (GSM) based cellular network), IEEE 802.11 networks, and/or other suitable radio-based networks. The network 18 may also employ any number of network communication protocols, such as Transmission Control Protocol (TCP) and Internet Protocol (IP). Although not explicitly shown in FIG. 1, network 18 may include a variety of network devices, such as servers, routers, network switches, and/or other network hardware devices configured to transport data over the network 18.

In FIG. 1, the network hosting the platform 20 may be a remote network (e.g., a cloud network) that is able to communicate with the client devices 14A-C via the client network 12 and network 18. The network hosting the platform 20 provides additional computing resources to the client devices 14A-C and/or client network 12. For example, by utilizing the network hosting the platform 20, users of client devices 14A-C are able to build and execute applications for various enterprise, IT, and/or other organization-related functions. In one embodiment, the network hosting the platform 20 is implemented on one or more data centers 22, where each data center could correspond to a different geographic location. Each of the data centers 22 includes a plurality of virtual servers 24 (also referred to herein as application nodes, application servers, virtual server instances, application instances, or application server instances), where each virtual server can be implemented on a physical computing system, such as a single electronic computing device (e.g., a single physical hardware server) or across multiple-computing devices (e.g., multiple physical hardware servers). Examples of virtual servers 24 include, but are not limited to a web server (e.g., a unitary web server installation), an application server (e.g., unitary JAVA Virtual Machine), and/or a database server, e.g., a unitary relational database management system (RDBMS) catalog.

To utilize computing resources within the platform 20, network operators may choose to configure the data centers 22 using a variety of computing infrastructures. In one embodiment, one or more of the data centers 22 are configured using a multi-tenant cloud architecture, such that one of the server instances 24 handles requests from and serves multiple customers. Data centers with multi-tenant cloud architecture commingle and store data from multiple customers, where multiple customer instances are assigned to one of the virtual servers 24. In a multi-tenant cloud architecture, the particular virtual server 24 distinguishes between and segregates data and other information of the various customers. For example, a multi-tenant cloud architecture could assign a particular identifier for each customer in order to identify and segregate the data from each customer. Generally, implementing a multi-tenant cloud architecture may suffer from various drawbacks, such as a failure of a particular one of the server instances 24 causing outages for all customers allocated to the particular server instance.

In another embodiment, one or more of the data centers 22 are configured using a multi-instance cloud architecture to provide every customer its own unique customer instance or instances. For example, a multi-instance cloud architecture could provide each customer instance with its own dedicated application server(s) and dedicated database server(s). In other examples, the multi-instance cloud architecture could deploy a single physical or virtual server and/or other combinations of physical and/or virtual servers 24, such as one or more dedicated web servers, one or more dedicated application servers, and one or more database servers, for each customer instance. In a multi-instance cloud architecture, multiple customer instances could be installed on one or more respective hardware servers, where each customer instance is allocated certain portions of the physical server resources, such as computing memory, storage, and processing power. By doing so, each customer instance has its own unique software stack that provides the benefit of data isolation, relatively less downtime for customers to access the platform 20, and customer-driven upgrade schedules. An example of implementing a customer instance within a multi-instance cloud architecture will be discussed in more detail below with reference to FIG. 2.

Figure 2:
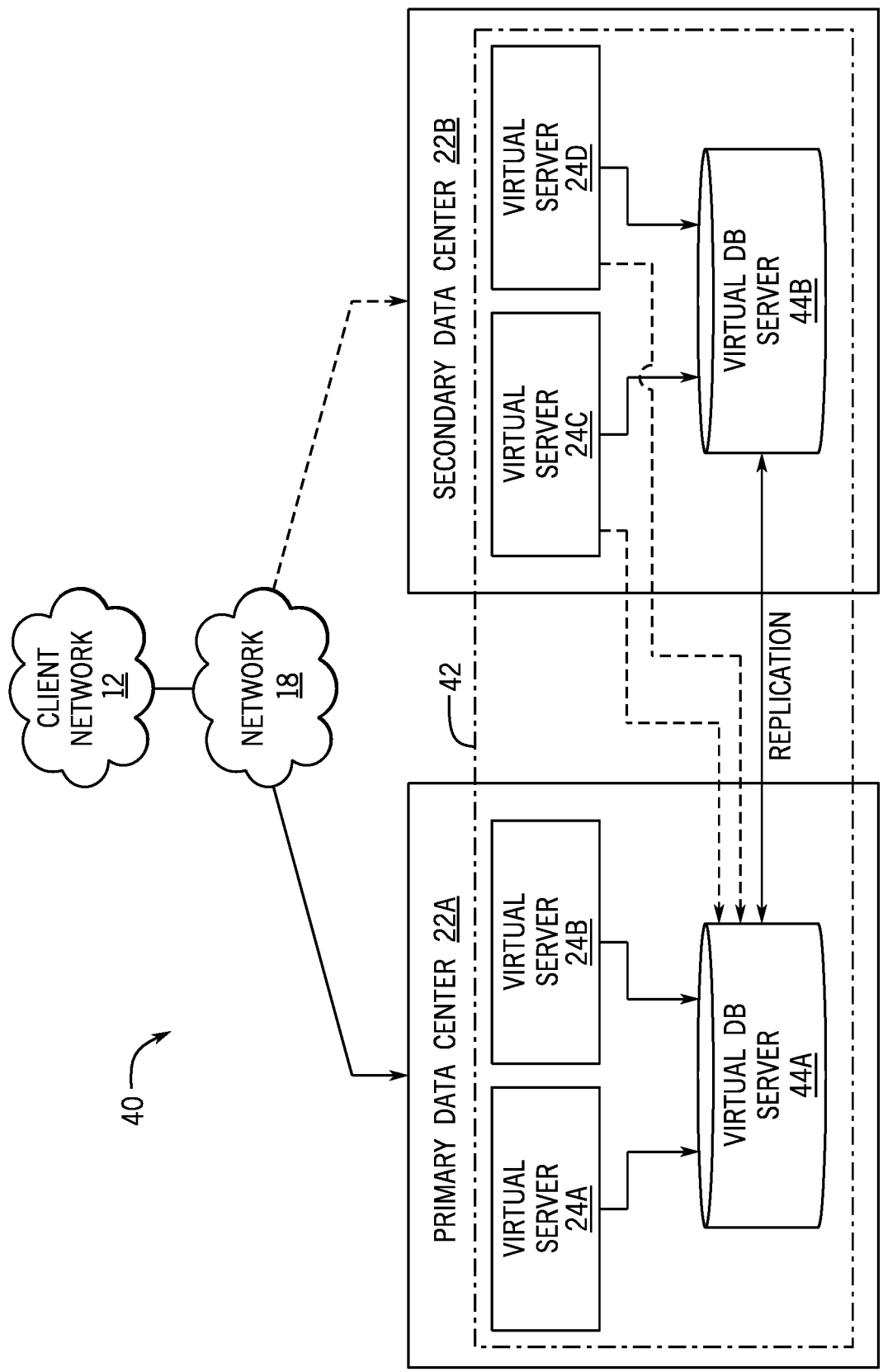
FIG. 2 is a block diagram of an embodiment of a multi-instance cloud architecture in which embodiments of the present disclosure may operate.

FIG. 2 is a schematic diagram of an embodiment of a multi-instance cloud architecture 40 where embodiments of the present disclosure may operate. FIG. 2 illustrates that the multi-instance cloud architecture 40 includes the client network 12 and the network 18 that connect to two (e.g., paired) data centers 22A and 22B that may be geographically separated from one another. Using FIG. 2 as an example, network environment and service provider cloud infrastructure client instance 42 (also referred to herein as a client instance 42) is associated with (e.g., supported and enabled by) dedicated virtual servers (e.g., virtual servers 24A, 24B, 24C, and 24D) and dedicated database servers (e.g., virtual database servers 44A and 44B). Stated another way, the virtual servers 24A-24D and virtual database servers 44A and 44B are not shared with other client instances and are specific to the respective client instance 42. Other embodiments of the multi-instance cloud architecture 40 could include other types of dedicated virtual servers, such as a web server. For example, the client instance 42 could be associated with (e.g., supported and enabled by) the dedicated virtual servers 24A-24D, dedicated virtual database servers 44A and 44B, and additional dedicated virtual web servers (not shown in FIG. 2).

In the depicted example, to facilitate availability of the client instance 42, the virtual servers 24A-24D and virtual database servers 44A and 44B are allocated to two different data centers 22A and 22B, where one of the data centers 22 acts as a backup data center. In reference to FIG. 2, data center 22A acts as a primary data center that includes a primary pair of virtual servers 24A and 24B and the primary virtual database server 44A associated with the client instance 42. Data center 22B acts as a secondary data center 22B to back up the primary data center 22A for the client instance 42. To back up the primary data center 22A for the client instance 42, the secondary data center 22B includes a secondary pair of virtual servers 24C and 24D and a secondary virtual database server 44B. The primary virtual database server 44A is able to replicate data to the secondary virtual database server 44B (e.g., via the network 18).

As shown in FIG. 2, the primary virtual database server 44A may back up data to the secondary virtual database server 44B using a database replication operation. The replication of data between data could be implemented by performing full backups weekly and daily incremental backups in both data centers 22A and 22B. Having both a primary data center 22A and secondary data center 22B allows data traffic that typically travels to the primary data center 22A for the client instance 42 to be diverted to the second data center 22B during a failure and/or maintenance scenario. Using FIG. 2 as an example, if the virtual servers 24A and 24B and/or primary virtual database server 44A fails and/or is under maintenance, data traffic for client instances 42 can be diverted to the secondary virtual servers 24C and/or 24D and the secondary virtual database server instance 44B for processing.

Although FIGS. 1 and 2 illustrate specific embodiments of a cloud computing system 10 and a multi-instance cloud architecture 40, respectively, the disclosure is not limited to the specific embodiments illustrated in FIGS. 1 and 2. For instance, although FIG. 1 illustrates that the platform 20 is implemented using data centers, other embodiments of the platform 20 are not limited to data centers and can utilize other types of remote network infrastructures. Moreover, other embodiments of the present disclosure may combine one or more different virtual servers into a single virtual server or, conversely, perform operations attributed to a single virtual server using multiple virtual servers. For instance, using FIG. 2 as an example, the virtual servers 24A-D and virtual database servers 44A and 44B may be combined into a single virtual server. Moreover, the present approaches may be implemented in other architectures or configurations, including, but not limited to, multi-tenant architectures, generalized client/server implementations, and/or even on a single physical processor-based device configured to perform some or all of the operations discussed herein. Similarly, though virtual servers or machines may be referenced to facilitate discussion of an implementation, physical servers may instead be employed as appropriate. The use and discussion of FIGS. 1 and 2 are only examples to facilitate ease of description and explanation and are not intended to limit the disclosure to the specific examples illustrated therein.

As may be appreciated, the respective architectures and frameworks discussed with respect to FIGS. 1 and 2 incorporate computing systems of various types (e.g., servers, workstations, client devices, laptops, tablet computers, cellular telephones, and so forth) throughout. For the sake of completeness, a brief high level overview of components typically found in such systems is provided. As may be appreciated, the present overview is intended to merely provide a high-level, generalized view of components typical in such computing systems and should not be viewed as limiting in terms of components discussed or omitted from discussion.

Figure 3:
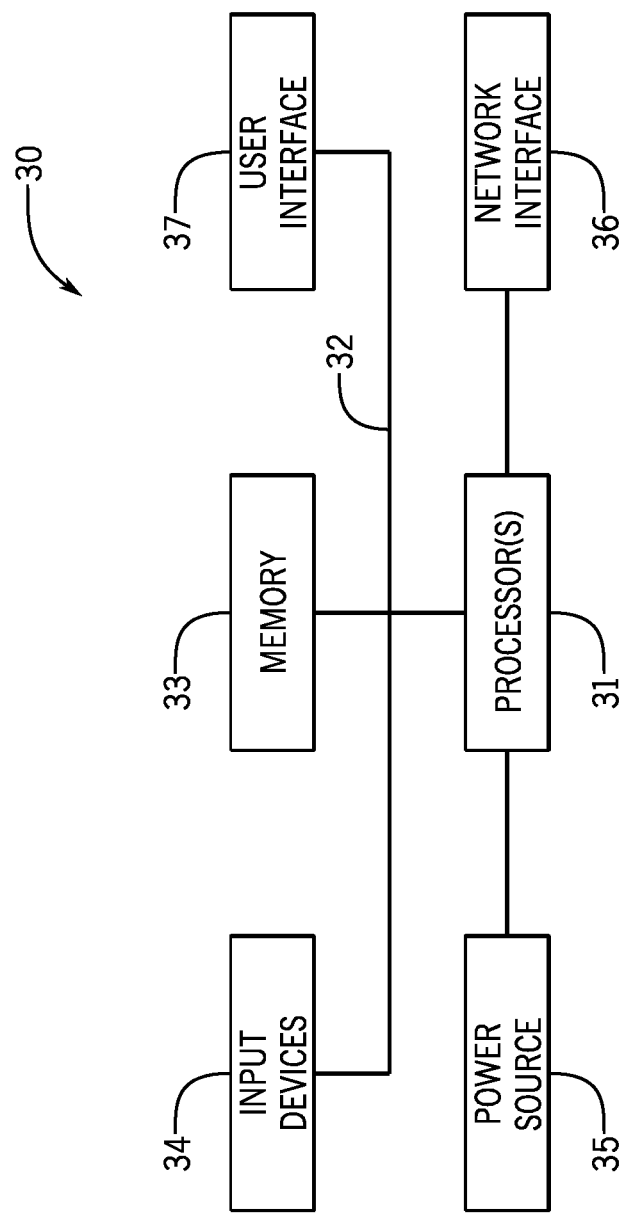
FIG. 3 is a block diagram of a computing device utilized in a computing system that may be present in FIG. 1 or 2, in accordance with aspects of the present disclosure.

With this in mind, and by way of background, it may be appreciated that the present approach may be implemented using one or more processor-based systems such as shown in FIG. 3. Likewise, applications and/or databases utilized in the present approach stored, employed, and/or maintained on such processor-based systems. As may be appreciated, such systems as shown in FIG. 3 may be present in a distributed computing environment, a networked environment, or other multi-computer platform or architecture. Likewise, systems such as that shown in FIG. 3, may be used in supporting or communicating with one or more virtual environments or computational instances on which the present approach may be implemented.

With this in mind, an example computer system may include some or all of the computer components depicted in FIG. 3. FIG. 3 generally illustrates a block diagram of example components of a computing system 30 and their potential interconnections or communication paths, such as along one or more busses. As illustrated, the computing system 30 may include various hardware components such as, but not limited to, one or more processors 31, one or more busses 32, memory 33, input devices 34, a power source 35, a network interface 36, a user interface 37, and/or other computer components useful in performing the functions described herein.

The one or more processors 31 may include one or more microprocessors capable of performing instructions stored in the memory 33. Additionally or alternatively, the one or more processors 31 may include application-specific integrated circuits (ASICs), field-programmable gate arrays (FPGAs), and/or other devices designed to perform some or all of the functions discussed herein without calling instructions from the memory 33.

With respect to other components, the one or more busses 32 includes suitable electrical channels to provide data and/or power between the various components of the computing system 30. The memory 33 may include any tangible, non-transitory, and computer-readable storage media. Although shown as a single block in FIG. 3, the memory 33 can be implemented using multiple physical units of the same or different types in one or more physical locations. The input devices 34 correspond to structures to input data and/or commands to the one or more processor 31. For example, the input devices 34 may include a mouse, touchpad, touchscreen, keyboard and the like. The power source 35 can be any suitable source for power of the various components of the computing device 30, such as line power and/or a battery source. The network interface 36 includes one or more transceivers capable of communicating with other devices over one or more networks (e.g., a communication channel). The network interface 36 may provide a wired network interface or a wireless network interface. A user interface 37 may include a display that is configured to display text or images transferred to it from the one or more processors 31. In addition and/or alternative to the display, the user interface 37 may include other devices for interfacing with a user, such as lights (e.g., LEDs), speakers, and the like.

The present disclosure includes embodiments of the cloud-based platform 20, the one or more data centers 22A-B, and/or the computing system 30 that facilitate analyzing client instance performance trends to predict future client instance performance and adjusting thresholds used to send resource utilization alerts based on analyzing the client instance performance trends. That is, a data center (e.g., 22A) may estimate when resources may become overutilized based on metrics associated with client instance performance, such as number of transactions occurring in client instances provided by a virtual server (e.g., 24A), number of users connected to the virtual server 24A, and/or response time of the virtual server 24A to user requests. In particular, the data center 22A may set thresholds associated with the metrics to determine and/or predict when resources may become overutilized. When these thresholds are exceeded, the data center 22A and may send an alert to, for example, an engineer maintaining the cloud-based platform 20 that there may be an impending resource allocation problem. The engineer may then take appropriate precautions (e.g., rationing the remaining resources, reallocating the resources, and the like.) The data center 22A may also dynamically adjust the thresholds based on current or recent metrics data and/or factor in other or relevant details associated with resource usage (e.g., the time of day or the day of the week) to more accurately determine and/or predict when resources may become overutilized. Moreover, the data center 22A may classify, group, and/or pattern match the performance data based on historical trends to characterize the performance data as indicative of certain circumstances, such as whether resources are likely to become insufficient to handle upcoming utilization. As such, analytics performed by the data center 22A may be more accurate and may better anticipate future usage of the resources.

Figure 4:
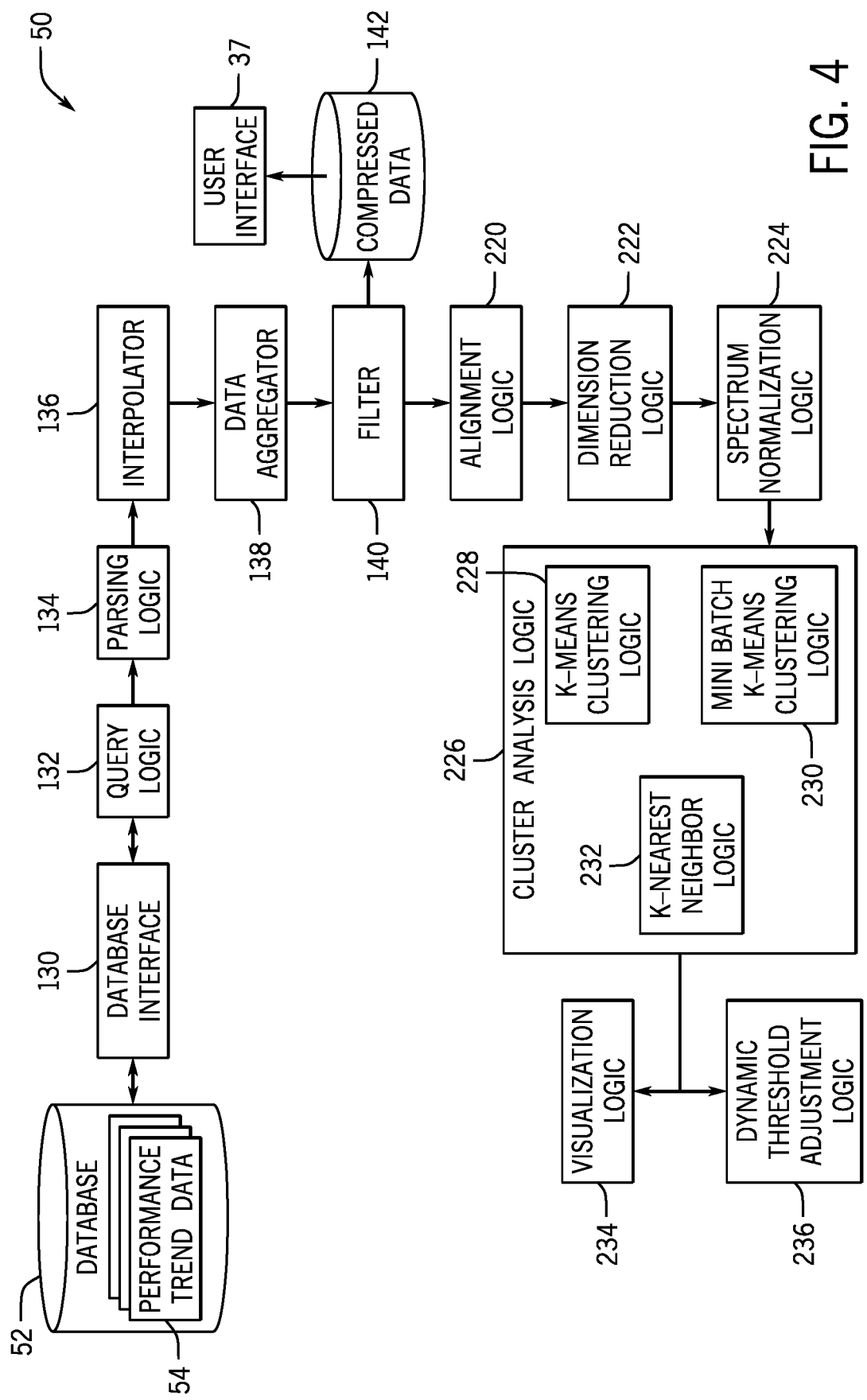
FIG. 4 is a block diagram of a system for adjusting thresholds used to send resource utilization alerts based on performance trend or temporal data, according to embodiments of the present disclosure.

With the foregoing in mind, FIG. 4 is a block diagram of a system 50 for adjusting thresholds used to send resource utilization alerts based on performance trend or temporal data, according to embodiments of the present disclosure. The system 50 may be implemented as part of a data center (e.g., 22A) and/or a computing system (e.g., 30). As such, one or more processors, such as the processor 31, may instruct the components of the system 50 to perform various tasks. The system 50 includes a database 52 which stores the performance trend data 54. The performance trend data 54 may be gathered by the data center 22A from any client instance 42 hosted by the data center 22A (and even client instances 42 hosted by other data centers communicatively coupled to the data center 22A), and may include any suitable data indicative of performance of the cloud-based platform 20, the data center 22A, the virtual server 24A, and/or the client instances 42, such as those associated with performance trend metrics (e.g., number of transactions occurring in the virtual server 24A, number of users connected to the virtual server 24A, and/or response time of the virtual server 24A to user requests). The database 52 may be stored in, for example, the virtual database server 44A.

Figure 5:
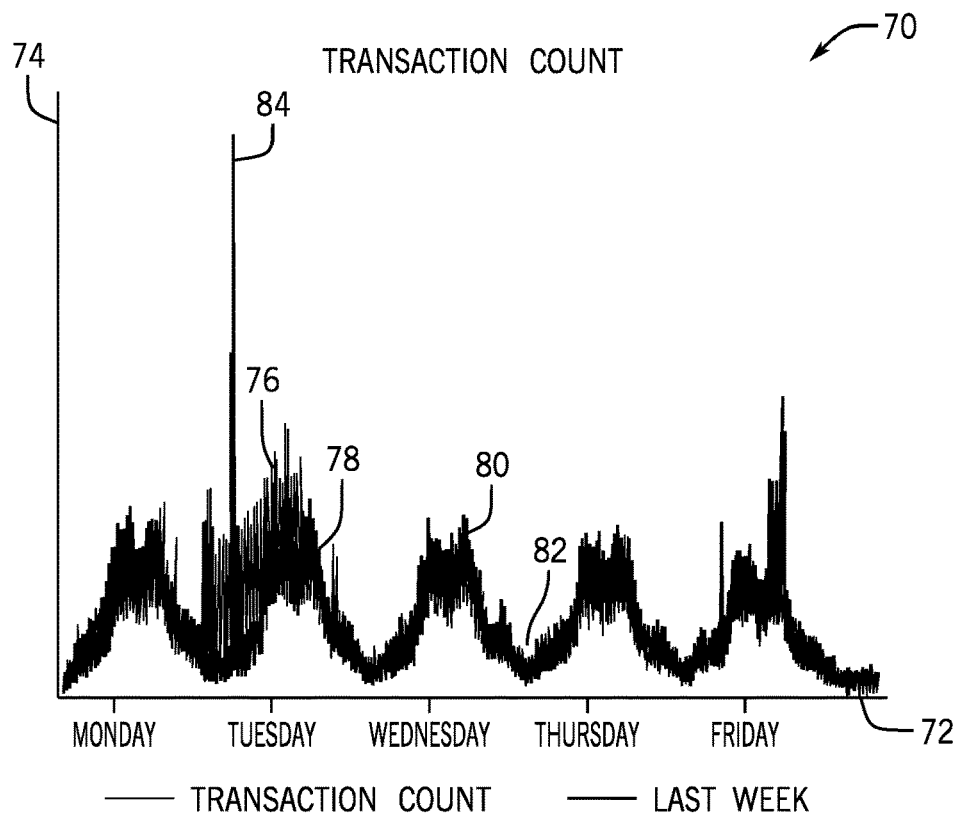
FIG. 5 is an example plot illustrating transaction count on a virtual server over time, according to embodiments of the present disclosure.
Figure 6:
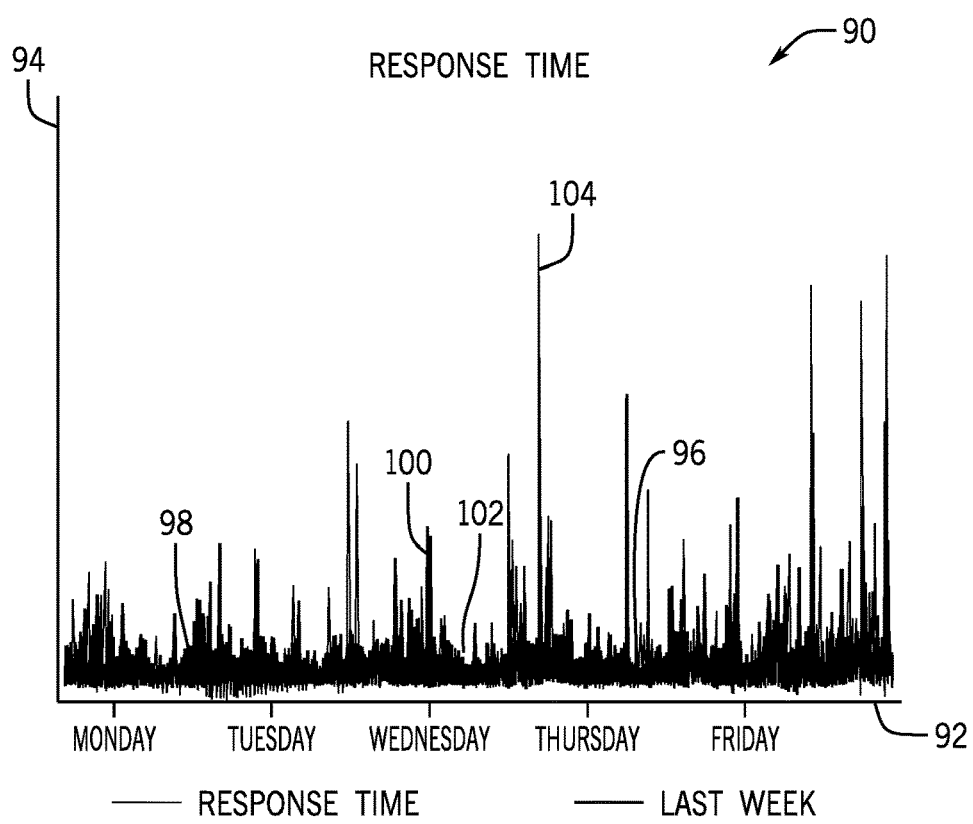
FIG. 6 is an example plot illustrating response time of a virtual server over time, according to embodiments of the present disclosure.
Figure 7:
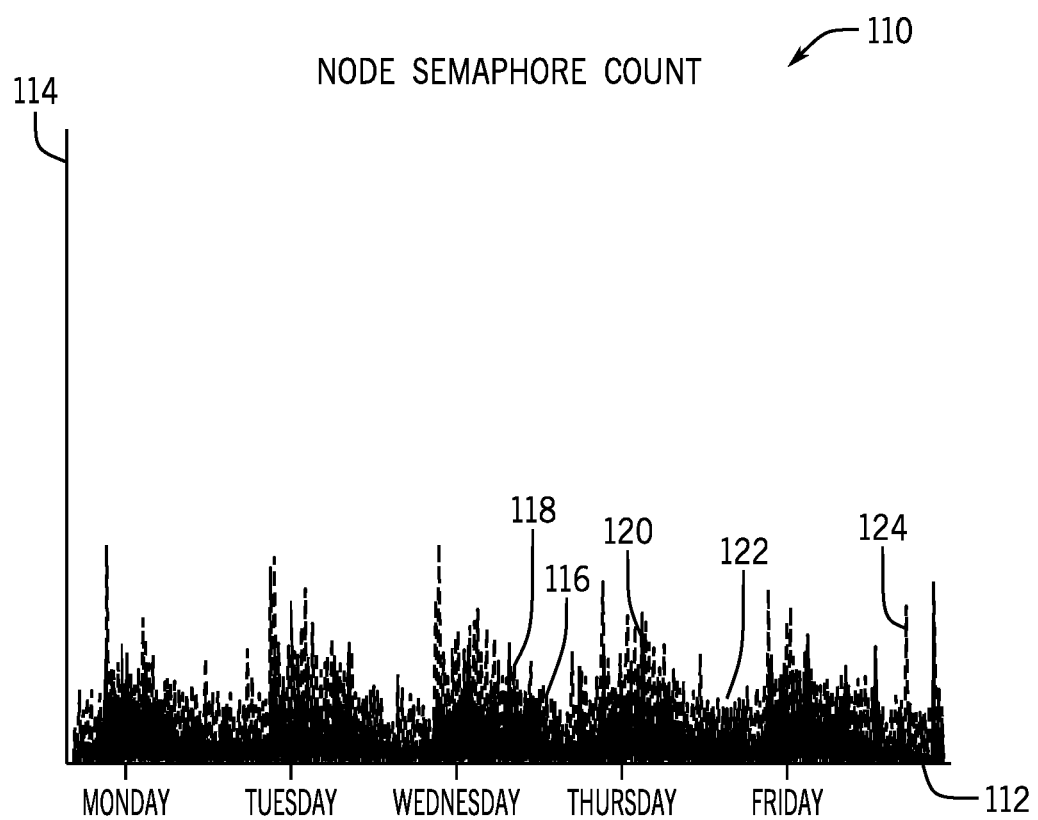
FIG. 7 is an example plot illustrating number of semaphores in use by (or number of users connected to) a virtual server over time, according to embodiments of the present disclosure.

With this in mind, FIGS. 5-7 are example plots illustrating different performance trend data 54, according to embodiments of the present disclosure. In particular, FIG. 5 is an example plot 70 illustrating transaction count on the virtual server 24A over time, according to embodiments of the present disclosure. The plot 70 includes an abscissa or horizontal axis 72 which represents time and an ordinate or vertical axis 74 which represents a number of transactions of the virtual server 24A. Specifically, the plot 70 includes two sets of transaction count data, one set associated with transaction count for a current week 76 and one set associated with transaction count for the previous week 78. That is, each set 76, 78 of transaction count data represents the number of transactions performed by users of the virtual server 24A during the current week and the previous week. As illustrated, the sets of associated with transaction count data 76, 78 appear to be generally periodic or regular, with periodic or regular peaks 80 in transaction count and valleys 82 in transaction count, though anomalies 84 in transaction counts may exist. While the plot 70 illustrates transaction counts of the virtual server 24A, it should be understood that transaction counts of any suitable component of the cloud-based platform 20 may be used as performance trend data 54, such as transaction counts of the client instance 42 or the cloud-based platform 20 itself.

FIG. 6 is an example plot 90 illustrating response time of the virtual server 24A over time, according to embodiments of the present disclosure. The plot 90 includes an abscissa or horizontal axis 92 which represents time and an ordinate or vertical axis 94 which represents a response time of the virtual server 24A. Specifically, the plot 90 includes two sets of response time data, one set associated with response time for a current week 96 and one set associated with response time for the previous week 98. That is, each set 96, 98 of response time data represents the response time of the virtual server 24A in response to requests from users of the virtual server 24A during the current week and the previous week. As illustrated, the sets of associated with response time data 96, 98 appear to be generally periodic or regular, with periodic or regular peaks 100 in response time and valleys 102 in response time, though anomalies 104 in response time may exist. While the plot 90 illustrates response time of the virtual server 24A, it should be understood that response time of any suitable component of the cloud-based platform 20 may be used as performance trend data 54, such as response time of the client instance 42 or the cloud-based platform 20 itself.

FIG. 7 is an example plot 110 illustrating number of semaphores in use by (or number of users connected to) the virtual server 24A over time, according to embodiments of the present disclosure. That is, semaphores of the virtual server 24A or node may control the number of users that may be connected to the virtual server 24A. For example, each semaphore of the virtual server 24A may represent a certain number of users (e.g., one) connected to the virtual server 24A. The plot 110 includes an abscissa or horizontal axis 112 which represents time and an ordinate or vertical axis 114 which represents a semaphore count of the virtual server 24A. Specifically, the plot 110 includes two sets of semaphore count data, one set associated with semaphore count for a current week 116 and one set associated with semaphore count for the previous week 118. That is, each set 116, 118 of semaphore count data represents the semaphore count of the virtual server 24A during the current week and the previous week. As illustrated, the sets of associated with semaphore count data 116, 118 appear to be generally periodic or regular, with periodic or regular peaks 120 in response time and valleys 122 in semaphore count, though anomalies 124 in semaphore count may exist. While the plot 110 illustrates semaphore count of the virtual server 24A, it should be understood that semaphore count of any suitable component of the cloud-based platform 20 may be used as performance trend data 54, such as semaphore count of the client instance 42 or the cloud-based platform 20 itself.

Returning to the system 50 of FIG. 4, a database interface 56 may enable query logic 58 to send queries to the database 52 and return results in the form of performance trend data 54. The term logic as used in the present disclosure may include hardware (e.g., circuitry), software (e.g., instructions for execution by a processor), or a combination of the two. The processor 31 or a user may formulate the queries sent by the query logic 58 to the database interface 56. The queries may be based on the performance trend metrics and/or specify relevant time ranges (e.g., metrics for a current or previous day, week, month, or year).

Parsing logic 134 may parse the performance trend data results of a query sent by the query logic 58 into constituents and/or into a format that may be analyzed by, for example, the processor 31. For any missing data in the performance trend data results, an interpolator 136 may interpolate new data based on context provided from the performance trend data results. A data aggregator 138 may aggregate multiple performance trend data results for a desired time range. For example, the query logic 58 may return daily performance trend data results and store them (e.g., in the memory 33). If a user desires to see performance trend data results over a greater span of time (e.g., for a week, month, or year), the data aggregator 138 may aggregate the performance trend data results for that greater span of time.

A frequency-based filter 140 may compress the performance trend data results to generate compressed data 142. In particular, the frequency-based filter 140 may be any suitable filter that removes high frequency noise from the performance trend data results to retain low frequency performance trend data (e.g., the compressed data 142). For example, the frequency-based filter 140 may perform a fast Fourier transform algorithm to sample the performance trend data results over time and divide the performance trend data results into frequency components. The frequency-based filter 140 may then remove high frequency noise components from these frequency components. In alternative or additional embodiments, the frequency-based filter 140 may perform any other suitable algorithm that may remove high frequency noise from the performance trend data results, such as a wavelet transform algorithm.

Figure 8:
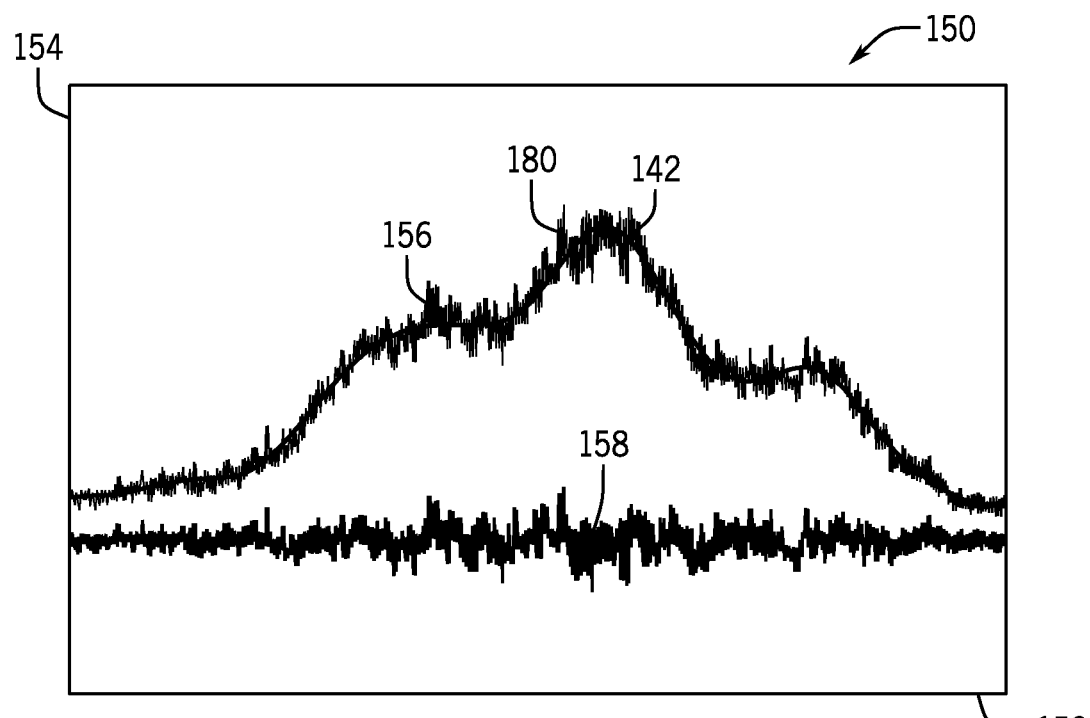
FIG. 8 is an example plot illustrating filtered or compressed performance trend data over time, according to embodiments of the present disclosure.

For example, FIG. 8 is an example plot 150 illustrating compressed performance trend data 142 over time, according to embodiments of the present disclosure. The plot 150 includes an abscissa or horizontal axis 152 which represents time (e.g., one week) and an ordinate or vertical axis 154 which represents a metric associated with client instance performance (e.g., transaction count on the virtual server 24A, response time of the virtual server 24A, or number of semaphores in use by the virtual server 24A). Specifically, the plot 150 includes the performance trend data results 156 (e.g., in the form of a signal) returned from the database 52 (e.g., and aggregated by the data aggregator 138). After the filter 140 removes high frequency noise 158 from the performance trend data results 156 (e.g., by applying a fast Fourier transform algorithm), the low frequency performance trend data or separated regular pattern data 142 (e.g., the filtered or compressed data) remains. The high frequency noise 158 is also graphed in the plot 150.

Figure 9:
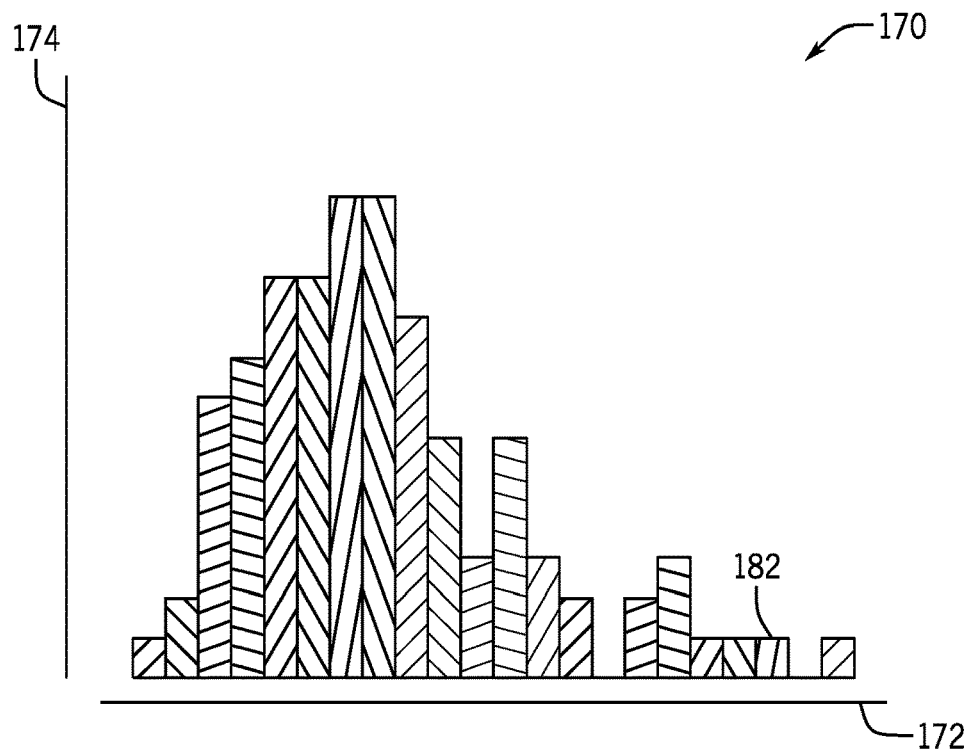
FIG. 9 is an example histogram illustrating frequency of values in filtered or compressed performance trend data, according to embodiments of the present disclosure.

The filtered or compressed data 142 may also be represented in a histogram 170, as shown in FIG. 9, which has an abscissa or horizontal axis 172 which represents a value or index of the metric associated with client instance performance (e.g., transaction count on the virtual server 24A, response time of the virtual server 24A, or number of semaphores in use by the virtual server 24A) and an ordinate or vertical axis 174 which represents a frequency of the value or index of the metric (for a given time period).

Returning to the system 50 of FIG. 4, the processor 31 may send the filtered or compressed data 142 to a user interface (e.g., the user interface 37) to be viewed and/or analyzed by a user. In some embodiments, the user interface 37 may enable a user to select data points of the compressed performance trend data 142 and conveniently view frequency of the selected data point. For example, the user interface 37 may display both the plot 150 illustrating compressed performance trend data 142 of FIG. 8 and the histogram 170 of FIG. 9, and enable a user to select a data point (e.g., 180) on the plot 150, and, in response to the user selecting the data point 180, highlight or otherwise indicate the frequency 182 of the data point 180 on the histogram 170.

The processor 31 may also group sets of compressed data 142 (e.g., gathered over different time periods) together to be displayed on the user interface 37 for the user to analyze and get a better sense of how likely an event happens if it is an anomaly. For example, the user interface 37 may display an example plot 190 of FIG. 10 that illustrates superimposed compressed performance trend data 142 (e.g., transaction count) for different time periods, according to embodiments of the present disclosure. The plot 190 includes an abscissa or horizontal axis 192 which represents time and an ordinate or vertical axis 194 which represents the transaction count on the virtual server 24A. The plot 190 includes a first set of transaction count data for a current week 196 and a second set associated with transaction count for the previous week 198. The plot also include a weekly average 200 of transaction count data and a yearly average 202 of transaction count data. As such, the plot 190 provides an immediate comparison of transaction count data for a current week 196, the previous week 198, and weekly 200 and yearly averages 202.

Figure 10:
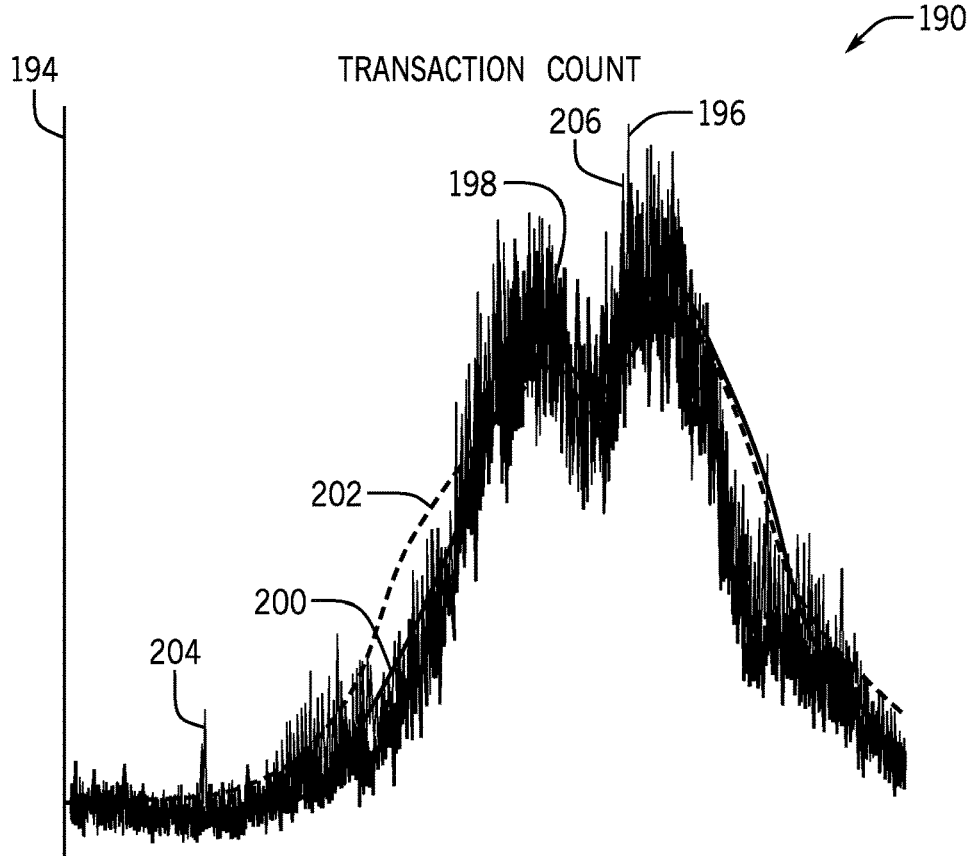
FIG. 10 is an example plot illustrating superimposed compressed performance trend data for different time periods, according to embodiments of the present disclosure.

In some embodiments, machine learning techniques may be used to analyze the plot 190 of the superimposed compressed data 142 illustrated in FIG. 10 and determine a relationship between resource utilization and certain data points of the plot 190 and/or the superimposed compressed data 142. In particular, the processor 31 may determine that certain data points indicate that there may likely be a lack or overutilization of resources, and a resource utilization alert should be sent. Additionally, the plot 190 enables a user or machine learning techniques to quickly and conveniently identify an anomaly (e.g., data point 204) and get a sense of how likely the anomaly occurs. That is, the anomaly 204 does not appear to be reflected in the transaction count for the previous week 198, the weekly average 200 of transaction count data, and the yearly average 202 of transaction count data, and, as such, the user may surmise that the anomaly 204 is not likely to reoccur. Furthermore, additional data may be included in the plot 190 and analyzed by the user or machine learning techniques, such as similar performance trend data provided from other servers, clients, or platforms (provided via, for example, results from using search engines).

Moreover, as with the plot 150 illustrating compressed performance trend data 142 of FIG. 8, the user interface 37 may enable a user to select data points of the first set of transaction count data for the current week 196 and conveniently view frequency of the selected data point. For example, the user interface 37 may display both the plot 190 illustrating superimposed compressed performance trend data 142 of FIG. 10 and an associated histogram (e.g., the histogram 170 of FIG. 9), and enable a user to select a data point (e.g., 206) on the plot 190, and, in response to the user selecting the data point 206, highlight or otherwise indicate the frequency (e.g., 182) of the data point 206 on the histogram 170.

Returning to the system 50 of FIG. 4, alignment logic 220 may align data in the filter or compressed data 142. For example, the alignment logic 220 may temporally align the compressed data 142 based on timezones at which the compressed data 142 was gathered. In particular, the alignment logic 220 may perform a Fast Fourier transform algorithm on the performance trend data 54 to generate a Fourier frequency spectrum of the temporal pattern of the performance trend data 54. The alignment logic 220 may then take the absolute value of the spectrum of the temporal pattern to reduce or eliminate the phase across the spectrum, leaving the magnitude across the spectrum (e.g., thus removing time zone misalignment). This may be relevant as peak and slow times in accessing resources provided by the cloud-based platform 20 in different timezones may not correspond unless the compressed data 142 is temporally aligned, resulting in mischaracterized data. Moreover, adjusting thresholds associated with sending performance trend alerts may be more effective as temporal differences (e.g., the time of day) in timezones where the compressed data 142 is gathered may be compensated for.

Dimension reduction logic 222 may reduce the number of random variables in the compressed data 142 by obtaining a set of principal or dominant variables. For example, the dimension reduction logic 222 may use feature projection to transform the compressed data 142 (which may exist in high-dimensional space due to the number of different values in the compressed data 142) to a space of fewer dimensions. In particular, the dimension reduction logic 222 may use principal component analysis to linearly transform the compressed data 142 into three-dimensional space. It should be understood that the dimension reduction logic 222 may use any suitable technique to reduce the number of random variables in the compressed data 142, such as feature selection, non-negative matrix factorization, kernel principal component analysis, linear discrimination analysis, generalized discrimination analysis, and/or autoencoder. Spectrum normalization logic 224 may then adjust values of the compressed data 142 (e.g., reduced by the dimension reduction logic 222) to a notionally common scale, based on a spectrum (e.g., or the number of dimensions) used to classify the compressed data 142.

The processor 31 may send the compressed data 142 (e.g., normalized by the spectrum normalization logic 224) to cluster analysis logic 226 to perform clustering analysis on the compressed data 142. The cluster analysis logic 226 may use any suitable clustering technique to separate, group, and/or classify the compressed data 142 into multiple clusters to characterize the compressed data 142 as indicative of certain circumstances, such as whether resources are likely to become insufficient to handle upcoming utilization. For example, the cluster analysis logic 226 may perform cosine similarity analysis by taking an inner soft product of two time series of data (including the compressed data 142) represented as two non-zero vectors and measuring the cosine of the angle between them to classify the two series of data into clusters. The numerical result of the inner soft product may indicate how similar the two time series of data are to each other, and be used by, for example, machine learning techniques to recognize patterns in the compressed data 142 to determine which patterns correspond to certain future behaviors of the cloud-based platform 20, such as when resources are likely to be overutilized. In some embodiments, the cluster analysis logic 226 may take an inner soft product of two time series of data in spectrum, instead of with temporal translation alignment.

As illustrated, the cluster analysis logic 226 may include k-means clustering logic 228 and mini batch k-means clustering logic 230. In particular, the k-means clustering logic 228 may partition the compressed data 142 into k clusters such that each data point of the compressed data 142 belongs to a cluster with a nearest mean. The mini batch k-means clustering logic 230 may partition the compressed data 142 into k clusters without using the entire set of compressed data 142 for each iteration (e.g., and instead use a subsample of the compressed data 142 of fixed size). As such, the mini batch k-means clustering logic 230 may reduce computational cost when compared to the k-means clustering logic 228. In additional or alternative embodiments, k-nearest neighbor logic 232 may use a k-nearest neighbor algorithm to classify the compressed data 142 into different classes based on a class most common among its nearest neighbors.

Figure 11:
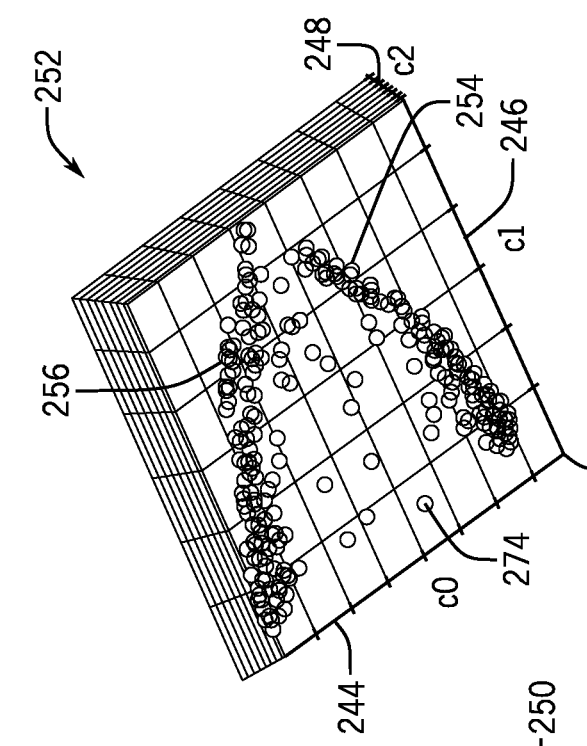
FIG. 11 is a first perspective view of an example three-dimensional plot of compressed performance trend data classified by cluster analysis logic, according to embodiments of the present disclosure.
Figure 12:
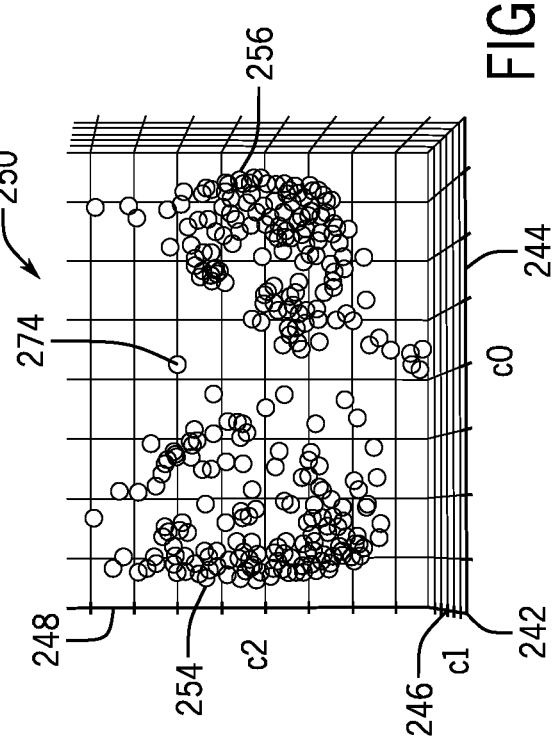
FIG. 12 is a second perspective view of the example three-dimensional plot of compressed performance trend data classified by cluster analysis logic, according to embodiments of the present disclosure.
Figure 13:
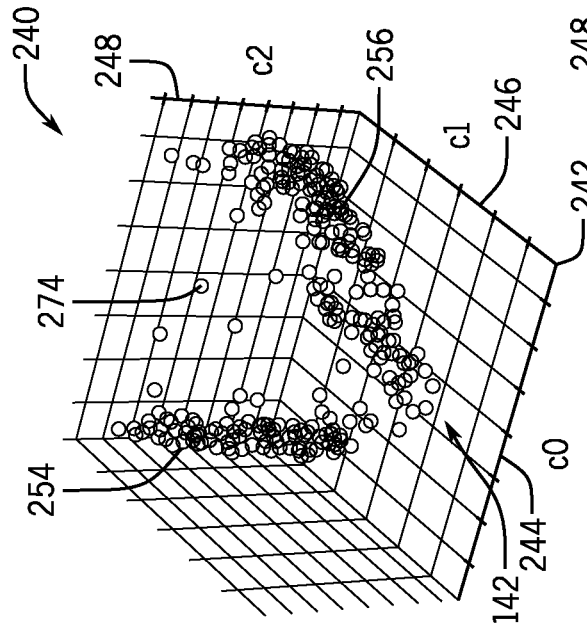
FIG. 13 is a third perspective view of the example three-dimensional plot of compressed performance trend data classified by cluster analysis logic, according to embodiments of the present disclosure.

The processor 31 may then send the compressed data 142 (e.g., classified by the cluster analysis logic 226) to visualization logic 234 to be displayed (e.g., on the user interface 37) for the user to analyze and view how the compressed data 142 has been classified. For example, FIGS. 11-13 are perspective views of an example three-dimensional plot of compressed data 142 classified by the cluster analysis logic 226 and displayed by the visualization logic 234, according to embodiments of the present disclosure. In particular, FIG. 11 is a first perspective view 240 of the example three-dimensional plot 242 of the compressed data 142 classified by the cluster analysis logic 226, according to embodiments of the present disclosure. The plot 242 includes a first dimension axis or x-axis 244, which corresponds to a first dimension of the compressed data 142 (e.g., c0). The plot 242 also includes a second dimension axis or y-axis 246, which corresponds to a second dimension of the compressed data 142 (e.g., c1). The plot 242 further includes a third dimension axis or z-axis 248, which corresponds to a third dimension of the compressed data 142 (e.g., c2). FIG. 12 is a second perspective view 250 and FIG. 13 is a third perspective view 252 of the example three-dimensional plot 242 of the compressed data 142 classified by the cluster analysis logic 226, according to embodiments of the present disclosure.

The perspective views 240, 250, 252, of the plot 242 illustrate the compressed data 142 classified by the cluster analysis logic 226 into a first cluster 254 and a second cluster 256. Each cluster 254, 256 indicates data points that share similar temporal behavior (e.g., possibly indicative of future resource utilization). The processor 31 may associate predictions of data points of the compressed data 142 of one cluster (e.g., 254) with other data points of the compressed data 142 that belong to the same cluster (e.g., 254). In this manner, analytics performed by the processor 31 may be more accurate and may better anticipate future usage of resources the cloud-based platform 20.

Figure 14:
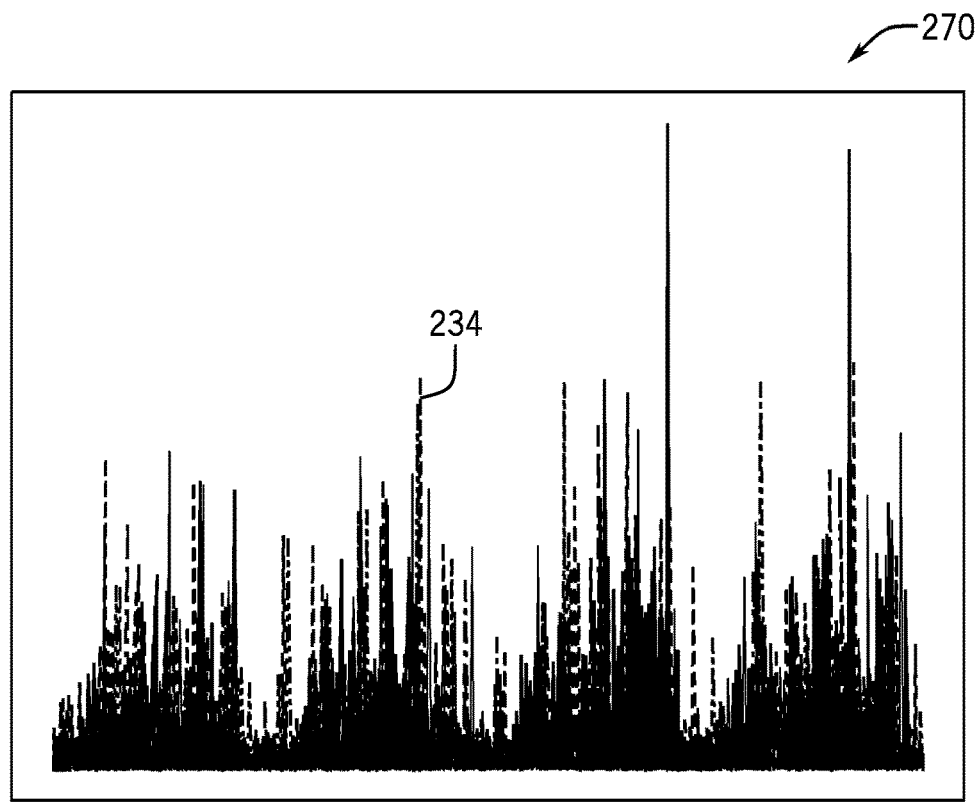
FIG. 14 is a two-dimensional plot of a first cluster of the example three-dimensional plot of compressed performance trend data classified by cluster analysis logic, according to embodiments of the present disclosure.
Figure 15:
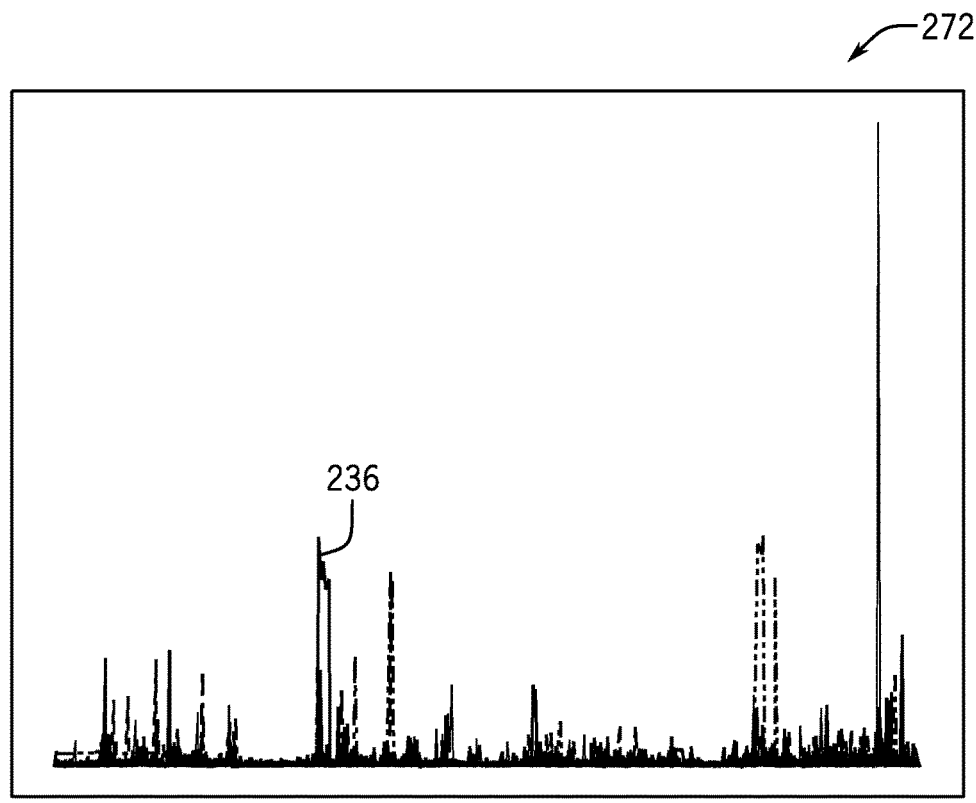
FIG. 15 is a two-dimensional plot of a second cluster of the example three-dimensional plot of compressed performance trend data classified by cluster analysis logic, according to embodiments of the present disclosure.

FIGS. 14-15 are two-dimensional plots of each of the clusters 254, 256, according to embodiments of the present disclosure. FIG. 14 is a first plot 270 of the first cluster 254 that exhibits more periodic and regular behavior, while FIG. 15 is a second plot 272 of the second cluster 256 that exhibits more random behavior. In some embodiments, machine learning techniques may be used to analyze the plot 242 and/or the plots 270, 272 of the compressed data 142 and determine a relationship between resource utilization and certain data points of the plot 242, the plots 270, 272, and/or the compressed data 142. In particular, the processor 31 may determine that certain data points indicate that there may likely be a lack or overutilization of resources, and a resource utilization alert should be sent. Additionally, the plot 242 and/or the plots 270, 272 enable a user or machine learning techniques to quickly and conveniently identify an anomaly (e.g., data point 274) and get a sense of how likely the anomaly occurs. That is, the anomaly 274 does appears to be separate from the clusters 254, 256, and, as such, the user may surmise that the anomaly 274 is not likely to reoccur. Furthermore, additional data may be used to generate the plot 242 and/or the plots 270 and analyzed by the user or machine learning techniques, such as similar performance trend data provided from other servers, clients, or platforms (provided via, for example, results from using search engines).

The processor 31 may also send the compressed data 142 to dynamic threshold adjustment logic 236, which may adjust one or more thresholds used to send resource utilization alerts based on the compressed data 142. Specifically, the processor 31 may send a resource utilization alert (e.g., an alert that resource overutilization is imminent or likely to occur, such that users of the cloud-based platform 20 may have transaction delays or not be able to perform transactions at all) when a threshold is exceeded. Each threshold may be associated with a performance trend metric, such as a number of transactions occurring in the virtual server 24A, a number of semaphores in use by (or number of users connected to) the virtual server 24A, and/or response time of the virtual server 24A to user requests. The dynamic threshold adjustment logic 236 may adjust the one or more thresholds based on analysis of the compressed data 142 (e.g., by the frequency based filter 140, the alignment logic 220, the dimension reduction logic 222, the spectrum normalization logic 224, and/or the cluster analysis logic).

For example, the processor 31 may analyze the plot 190 of the superimposed compressed data 142 illustrated in FIG. 10 and determine a relationship between resource utilization and certain data points of the plot 190 and/or the superimposed compressed data 142. In particular, the processor 31 may determine that certain data points (associated with a performance trend metric, such as a number of transactions occurring in the virtual server 24A, a number of semaphores in use by (or number of users connected to) the virtual server 24A, and/or response time of the virtual server 24A to user requests) indicate that there may likely be a lack or overutilization of resources, and a resource utilization alert should be sent. The processor 31 may also determine anomalous data points in the plot 190 and/or the superimposed compressed data 142 that may not be included in the certain data points that indicate that there may likely be a lack or overutilization of resources, as these anomalous data points may skew accuracy of the determined relationship between the performance trend data and resource utilization.

Similarly, the processor 31 may analyze the three-dimensional plot 242 of the compressed data 142 illustrated in FIGS. 11-13 and determine a relationship (or adjust the relationship determined based on the plot 190 of the superimposed compressed data 142 illustrated in FIG. 10) between resource utilization and certain data points of the plot 242 and/or the compressed data 142. In particular, the processor 31 may determine that data points (associated with a performance trend metric, such as a number of transactions occurring in the virtual server 24A, a number of semaphores in use by (or number of users connected to) the virtual server 24A, and/or response time of the virtual server 24A to user requests) that share a cluster (e.g., 254) are likely to indicate a similar degree of a lack or overutilization of resources, and a resource utilization alert should be sent. The processor 31 may also determine anomalous data points in the plot 190 and/or the superimposed compressed data 142 that may not be included in the certain data points that indicate that there may likely be a lack or overutilization of resources, as these anomalous data points may skew accuracy of the determined relationship between the performance trend data and resource utilization.

The dynamic threshold adjustment logic 236 may then adjust one or more thresholds associated with performance trend metrics based on the relationship between resource utilization and the certain data points of the plot 190, the certain data points of the plot 242, and/or the compressed data 142. For example, the processor 31 may send a resource utilization alert when a number of transactions occurring in the virtual server 24A exceeds a threshold number of transactions, a number of semaphores in use by the virtual server 24A exceeds a threshold number of semaphores, and/or response time of the virtual server 24A exceeds a threshold response time. The dynamic threshold adjustment logic 236 may adjust the threshold number of transactions, the threshold number of semaphores, and/or the threshold response time based on the relationship between resource utilization and the certain data points of the plot 190, the certain data points of the plot 242, and/or the compressed data 142.

As a further example, the virtual server 24A may include a queue for tasks or transactions requested by users to be performed. The processor 31 may send a resource utilization alert when an age of the oldest task in the queue exceeds a threshold age, which may be dynamically based on a performance trend metric. That is, the threshold age may be set based on a function of the performance trend metric, such as the number of transactions occurring in the virtual server 24A. For example, the processor 31 may send a resource utilization alert when an age of the oldest task in the queue exceeds the sum of a constant time and an amount of time dependent on the number of transactions occurring in the virtual server 24A over a period of time (e.g., nTX(t)), as shown in the condition below:

Age of oldest task in queue>4000+100*nTX(t)

As another example, the processor 31 may send a resource utilization alert when a number of tasks in the queue exceeds a threshold number of tasks, which may be dynamically based on a performance trend metric. That is, the threshold number of tasks may be set based on a function of the performance trend metric, such as the number of transactions occurring in the virtual server 24A. For example, the processor 31 may send a resource utilization alert when a number of tasks in the queue exceeds the sum of a constant number of tasks and a number of tasks on the number of transactions occurring in the virtual server 24A over a period of time (e.g., nTX(t)), as shown in the condition below:

Number of tasks in queue>250+10*nTX(t)

In this manner, the thresholds may be dynamically adjusted for changes in the the performance trend metrics, and thus performance trend alerts indicative of situations when resource utilization becomes high and resources become low may be more accurately sent. Additionally, while the system 50 is illustrated as including the components of FIG. 4, it should be understood that there may be more or less components than those illustrated in FIG. 4.

Figure 16:
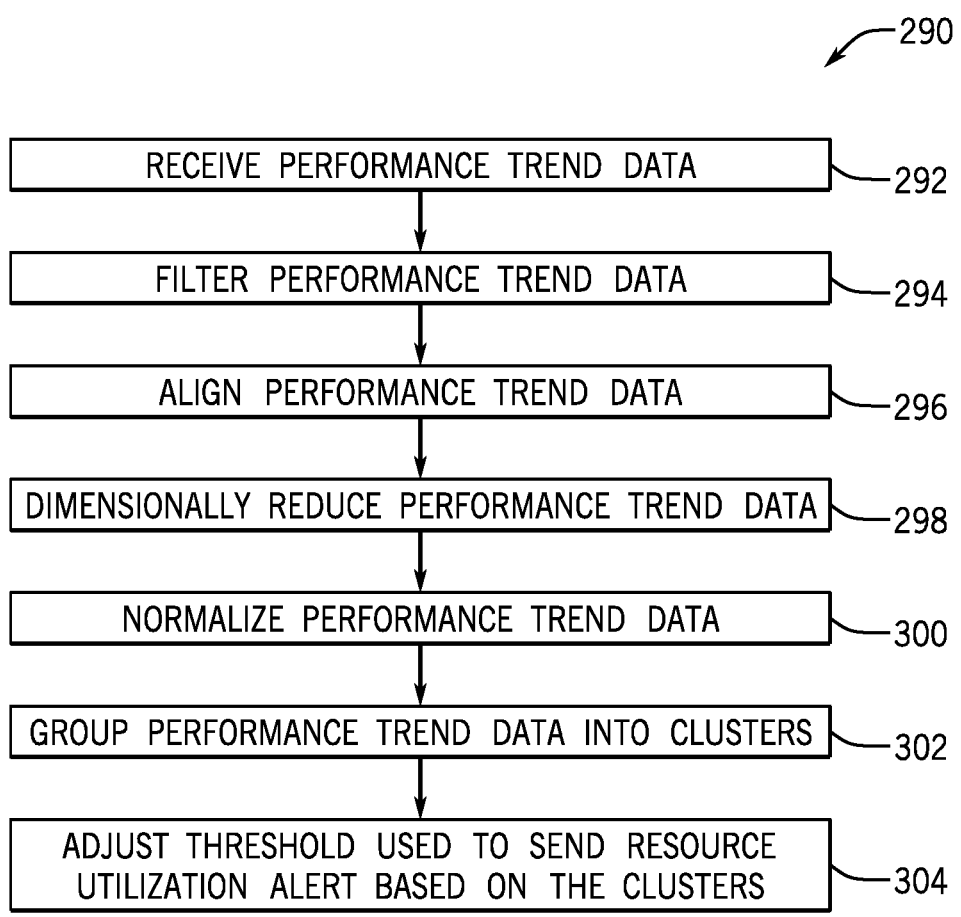
FIG. 16 is a flowchart of a process for dynamic threshold adjustment based on performance trend data, according to embodiments of the present disclosure.

FIG. 16 is a flowchart of a process 290 for dynamic threshold adjustment based on performance trend data, according to embodiments of the present disclosure. The process 290 may be implemented in the form of a software application that includes instructions executable by at least one suitable processor of a computer system as part of the cloud-based platform 20 and/or a virtual server (e.g., 24A) such as the processor 31. The illustrated process 290 is merely provided as an example, and in other embodiments, certain illustrated steps of the process 290 may be performed in other orders, skipped, or repeated, in accordance with the present disclosure.

As illustrated, in process block 292, the processor 31 receives performance trend data 54. The performance trend data 54 may include any suitable data indicative of performance of the cloud-based platform 20, such as those associated with performance trend metrics, such as number of transactions occurring in the virtual server 24A, number of users connected to the virtual server 24A, and/or response time of the virtual server 24A to user requests. The performance trend data 54 may be received from the database 52, via the database interface 130, queried via the query logic 132, parsed by the parsing logic 134, interpolated by the interpolator 136, and aggregated via the data aggregator 138.

In process block 294, the processor 31 filters the performance trend data 54. In particular, the processor 31 may instruct the frequency-based filter 140 to filter or compress the performance trend data 54. For example, the frequency-based filter 140 may perform a fast Fourier transform algorithm to sample the performance trend data 54 over time and divide the performance trend data 54 into frequency components. The frequency-based filter 140 may then remove high frequency noise components from these frequency components, as illustrated in the example plot 150 of FIG. 8. In alternative or additional embodiments, the frequency-based filter 140 may perform any other suitable algorithm that may remove high frequency noise from the performance trend data 54, such as a wavelet transform algorithm.

In process block 296, the processor 31 aligns the performance trend data 54. In particular, the processor 31 may instruct the alignment logic 220 to align the performance trend data 54. For example, the alignment logic 220 may temporally align the performance trend data 54 based on timezones at which the performance trend data 54 was gathered. In particular, the alignment logic 220 may perform a Fast Fourier transform algorithm on the performance trend data 54 to generate a Fourier frequency spectrum of the temporal pattern of the performance trend data 54. The alignment logic 220 may then take the absolute value of the spectrum of the temporal pattern to reduce or eliminate the phase across the spectrum, leaving the magnitude across the spectrum (e.g., thus removing time zone misalignment). This may be particularly important as peak and slow times in accessing resources provided by the cloud-based platform 20 in different timezones may not correspond unless the performance trend data 54 is temporally aligned, resulting in mischaracterized data. Moreover, adjusting thresholds associated with sending performance trend alerts may be more effective as temporal differences (e.g., the time of day) in timezones where the performance trend data 54 is gathered may be compensated for.

In process block 298, the processor 31 dimensionally reduces the performance trend data 54. In particular, the processor 31 may instruct the dimension reduction logic 222 to dimensionally reduce the performance trend data 54 by obtaining a set of principal or dominant variables. For example, the dimension reduction logic 222 may use feature projection to transform the performance trend data 54 (which may exist in high-dimensional space due to the number of different values in the performance trend data 54) to a space of fewer dimensions. In particular, the dimension reduction logic 222 may use principal component analysis to linearly transform the performance trend data 54 into three-dimensional space. It should be understood that the dimension reduction logic 222 may use any suitable technique to reduce the number of random variables in the performance trend data 54, such as feature selection, non-negative matrix factorization, kernel principal component analysis, linear discrimination analysis, generalized discrimination analysis, and/or autoencoder.

In process block 300, the processor 31 normalizes the performance trend data 54. In particular, the processor 31 may instruct the spectrum normalization logic 224 to normalize the performance trend data 54. For example, the spectrum normalization logic 224 may adjust values of the performance trend data 54 (e.g., reduced by the dimension reduction logic 222) to a notionally common scale, based on a spectrum (e.g., or the number of dimensions) used to classify the performance trend data 54.

In process block 302, the processor 31 groups performance trend data 54 into clusters. In particular, the processor 31 may instruct the cluster analysis logic 226 to perform clustering analysis on the performance trend data 54. The cluster analysis logic 226 may use any suitable clustering technique to separate, group, and/or classify the performance trend data 54 into multiple clusters to characterize the performance trend data 54 as indicative of certain circumstances, such as whether resources are likely to become insufficient to handle upcoming utilization. For example, the cluster analysis logic 226 may perform cosine similarity analysis by taking an inner soft product of two time series of data (including the performance trend data 54) represented as two non-zero vectors and measuring the cosine of the angle between them to classify the two series of data into clusters. The numerical result of the inner soft product may indicate how similar the two time series of data are to each other, and be used by, for example, machine learning techniques to recognize patterns in the performance trend data 54 to determine which patterns correspond to certain future behaviors of the cloud-based platform 20, such as when resources are likely to be overutilized. In some embodiments, the cluster analysis logic 226 may take an inner soft product of two time series of data in spectrum, instead of with temporal translation alignment.

As illustrated, the cluster analysis logic 226 may include k-means clustering logic 228 and mini batch k-means clustering logic 230. In particular, the k-means clustering logic 228 may partition the performance trend data 54 into k clusters such that each data point of the performance trend data 54 belongs to a cluster with a nearest mean. The mini batch k-means clustering logic 230 may partition the performance trend data 54 into k clusters without using the entire set of performance trend data 54 for each iteration (e.g., and instead use a subsample of the performance trend data 54 of fixed size). As such, the mini batch k-means clustering logic 230 may reduce computational cost when compared to the k-means clustering logic 228. In additional or alternative embodiments, k-nearest neighbor logic 232 may use a k-nearest neighbor algorithm to classify the performance trend data 54 into different classes based on a class most common among its nearest neighbors.

In process block 304, the processor 31 adjusts one or more thresholds used to send resource utilization alerts based on the clusters from process block 302. In particular, the processor 31 may instruct the dynamic threshold adjustment logic 236 to adjust the one or more thresholds based on analysis of the performance trend data 54 (e.g., by the frequency based filter 140, the alignment logic 220, the dimension reduction logic 222, the spectrum normalization logic 224, and/or the cluster analysis logic). For example, the processor 31 may determine a relationship between resource utilization and certain data points of the performance trend data 54 (e.g., as displayed by the plot 190 of the performance trend data 54 illustrated in FIG. 10 and/or the plot 242 of the performance trend data 54 illustrated in FIGS. 11-13). In particular, the processor 31 may determine that certain data points (associated with a performance trend metric, such as a number of transactions occurring in the virtual server 24A, a number of semaphores in use by (or number of users connected to) the virtual server 24A, and/or response time of the virtual server 24A to user requests) indicate that there may likely be a lack or overutilization of resources, and a resource utilization alert should be sent. The processor 31 may also determine anomalous data points in the performance trend data 54 that may not be included in the certain data points that indicate that there may likely be a lack or overutilization of resources, as these anomalous data points may skew accuracy of the determined relationship between the performance trend data and resource utilization.

The dynamic threshold adjustment logic 236 may adjust one or more thresholds associated with performance trend metrics based on the relationship between resource utilization and the certain data points of the performance trend data 54. For example, the processor 31 may send a resource utilization alert when a number of transactions occurring in the virtual server 24A exceeds a threshold number of transactions, a number of semaphores in use by the virtual server 24A exceeds a threshold number of semaphores, and/or response time of the virtual server 24A exceeds a threshold response time. The dynamic threshold adjustment logic 236 may adjust the threshold number of transactions, the threshold number of semaphores, and/or the threshold response time based on the relationship between resource utilization and the certain data points of the plot 190, the certain data points of the plot 242, and/or the compressed data 142.

In this manner, the process 290 may dynamically adjust thresholds based on changes in the performance trend metrics, and thus performance trend alerts indicative of situations when resource utilization becomes high and resources become low may be more accurately sent.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A system comprising:
a data center storing a database, wherein the database is configured to store performance data associated with at least one client instance hosted by one or more processors of the data center, wherein the at least one client instance is accessible to at least one client device, wherein the data center comprises the one or more processors and a memory device that stores instructions configured to be executed by the one or more processors to perform operations comprising:
temporally aligning a set of the performance data to generate a set of aligned performance data;
compressing the set of aligned performance data based on a frequency of values in the set of aligned performance data to remove high frequency noise from the set of aligned performance data and to generate a set of compressed performance data;
reducing random variables in the set of compressed performance data to obtain a set of variables from the set of compressed performance data; and
adjusting a threshold associated with sending a performance trend alert based on analyzing the set of variables from the set of compressed performance data.

2. The system of claim 1, wherein the operations comprise receiving, on a database interface, a request to perform a query on the database, to transfer the performance data from the database, or both.

3. The system of claim 1, wherein the operations comprise performing a query on the database to request the performance data.

4. The system of claim 1, wherein the set of the performance data is associated with a time period during which the performance data is collected, a time zone during which the performance data is collected, or both.

5. The system of claim 1, wherein the operations comprise parsing the set of the performance data based on one or more metrics.

6. The system of claim 5, wherein the one or more metrics comprise a transaction count, a response time, a node semaphore count, or a concurrent user count, or any combination thereof.

7. The system of claim 1, wherein the operations comprise interpolating values associated with missing data that is missing from the set of the performance data.

8. The system of claim 1, wherein the operations comprise aggregating a plurality of sets of performance data, wherein the plurality of sets of performance data comprises the set of the performance data.

9. The system of claim 1, wherein the set of aligned performance data is compressed based on a fast Fourier transform algorithm.

10. The system of claim 1, wherein the set of aligned performance data is compressed based on a wavelet transform algorithm.

11. The system of claim 1, wherein the operations comprise normalizing the set of the performance data based on a spectrum of the set of aligned performance data.

12. The system of claim 1, wherein the operations comprise partitioning the set of aligned performance data into a plurality of clusters.

13. The system of claim 12, wherein the operations comprise partitioning the set of aligned performance data using a k-means clustering algorithm, a k-nearest neighbor algorithm, or both.

14. The system of claim 12, wherein the operations comprise outputting a visualization of the plurality of clusters.

15. The system of claim 14, wherein the visualization comprises a three dimensional visualization.

16. The system of claim 1, wherein the operations comprise sending the performance trend alert based on a comparison of one or more values of the set of aligned performance data to the threshold.

17. The system of claim 1, wherein dimensionally reducing the performance data comprises linearly transforming the compressed performance data into a three-dimensional space, wherein the three-dimensional space comprises the set of variables.

18. A non-transitory, computer readable medium comprising instructions, wherein the instructions are configured to be executed by one or more processors to perform operations comprising:
receiving performance trend data indicative of performance of a cloud-based platform;
compressing the performance trend data by removing high frequency noise from the performance trend data in response to receiving the performance trend data;
temporally aligning the performance trend data in response to compressing the performance trend data;
dimensionally reducing the performance trend data in response to aligning the performance trend data, wherein dimensionally reducing the performance trend data comprises reducing random variables in the performance trend data to obtain a set of variables;
grouping the performance trend data into clusters in response to dimensionally reducing the performance trend data; and
adjusting one or more thresholds used to send one or more resource utilization alerts based on the clusters in response to grouping the performance trend data into the clusters.

19. A method comprising:
receiving, via one or more processors, performance trend data indicative of performance of a cloud-based platform;
compressing, via the one or more processors, the performance trend data in response to receiving the performance trend data to remove high frequency noise from the performance trend data;
aligning, via the one or more processors, the performance trend data in response to compressing the performance trend data;
dimensionally reducing, via the one or more processors, the performance trend data in response to aligning the performance trend data, wherein dimensionally reducing the performance trend data comprises reducing random variables in the performance trend data to obtain a set of variables;
normalizing, via the one or more processors, the performance trend data in response to dimensionally reducing the performance trend data;
grouping, via the one or more processors, the performance trend data into clusters in response to normalizing the performance trend data; and
adjusting, via the one or more processors, one or more thresholds used to send one or more resource utilization alerts based on the clusters in response to grouping the performance trend data into the clusters.

* * * * *